United States Patent [19]

Choi

[11] Patent Number: 6,080,514

[45] Date of Patent: Jun. 27, 2000

[54] FABRICATION METHOD OF MASK FOR SEMICONDUCTOR DEVICE

[75] Inventor: Yong-Kyoo Choi, Cheongju, Rep. of Korea

[73] Assignee: LG Semicon Co., Ltd., Chooncheongbuk-Do, Rep. of Korea

[21] Appl. No.: 09/166,968

[22] Filed: Oct. 6, 1998

[30] Foreign Application Priority Data

Nov. 7, 1997 [KR] Rep. of Korea ...................... 97-58667

[51] Int. Cl.$^7$ ...................................................... G03F 9/00
[52] U.S. Cl. ................................................................ 430/5
[58] Field of Search ................................ 430/5, 322, 323, 430/324; 378/35, 34

[56] References Cited

U.S. PATENT DOCUMENTS

| | | | |
|---|---|---|---|
| 5,567,550 | 10/1996 | Smayling | 430/5 |
| 5,876,877 | 3/1999 | Hanyu | 430/5 |

Primary Examiner—S. Rosasco

[57] ABSTRACT

A fabrication method of a mask for a semiconductor device includes the steps of: applying a first photoresist film on a silicone wafer; sequentially stacking a first insulation film, a second insulation film, and a second photoresist film on the first photoresist film; patterning the second photoresist film by an etching process; etching and patterning the first and second insulation films by using the patterned second photoresist film as a mask; etching and patterning the first photoresist film by using the patterned first and second insulation films, and patterned second photoresist film as a mask; removing the second photoresist film; etching a predetermined portion of the patterned first insulation film; depositing a metal on the wafer including the first photoresist film, the first insulation film having the predetermined etched portion, and the second insulation film; and removing the first photoresist film, and first and second insulation films from the wafer. Since a sidewall of the photoresist film has a predetermined portion on which the metal is not deposited and thus the metal is separately formed on an upper surface of the photoresist film and on the wafer when depositing the metal, the present invention is capable of removing the metal on the upper surface of the photoresist film by being separated from the metal formed on the wafer.

16 Claims, 9 Drawing Sheets

CONVENTIONAL ART

FIG. 1D

CONVENTIONAL ART

FIG. 1E

CONVENTIONAL ART

FABRICATION METHOD OF MASK FOR SEMICONDUCTOR DEVICE

BACKGROUND OF THE INVENTION

1. Field of the Invention

The present invention relates to a semiconductor device, and more particularly to a fabrication method of an electron-beam (E-beam)/X-ray mask for a semiconductor device applying a lift-off method.

2. Discussion of the Related Art

FIGS. 1A–1E sequentially illustrate a conventional fabrication method of an X-ray mask for a semiconductor device.

Figure 1A:
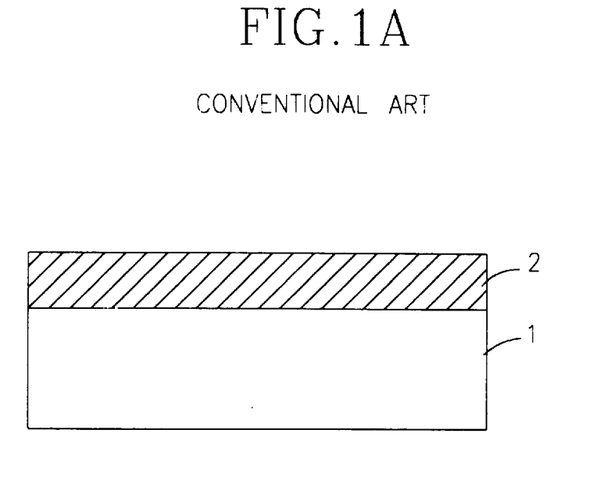
FIGS. 1A–1E sequentially illustrate a conventional fabrication method of an X-ray mask for a semiconductor device.

In FIG. 1A, a thin film (not shown) is formed on a silicon wafer 1, and an absorbent film (metal) 2 is deposited on the wafer 1 including the thin film. The thin film is formed of Si, SiC, or SiN, etc., and the absorbent film 2 is formed of tungsten (W), gold (Au), or platinum (Pt), etc.

Figure 1B:
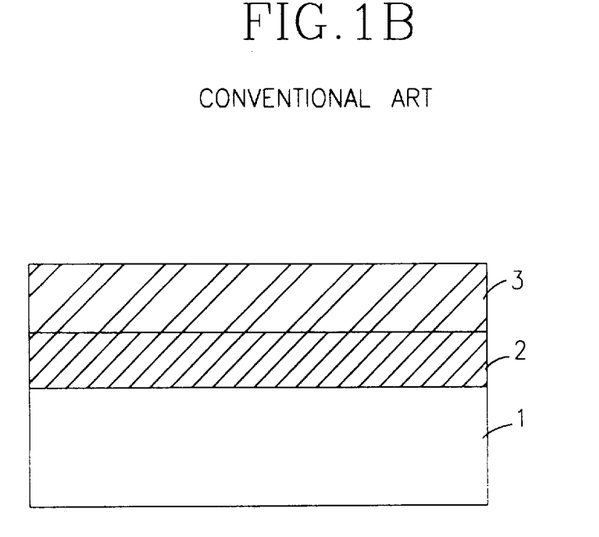

In FIG. 1B, a photoresist film 3 is applied and formed on the absorbent film 2.

Figure 1C:
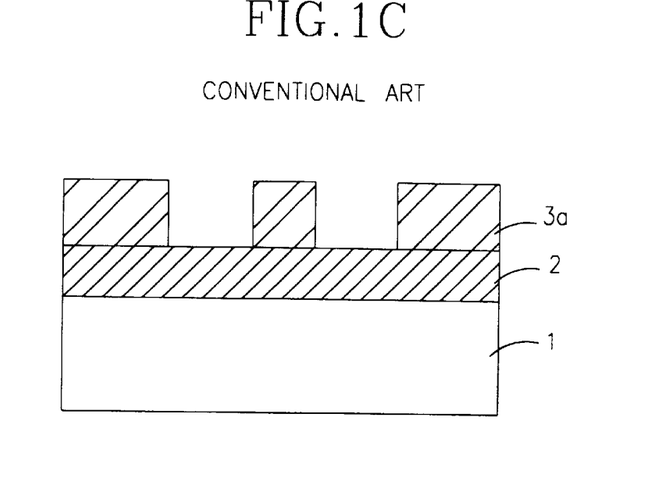
Figure 1D:
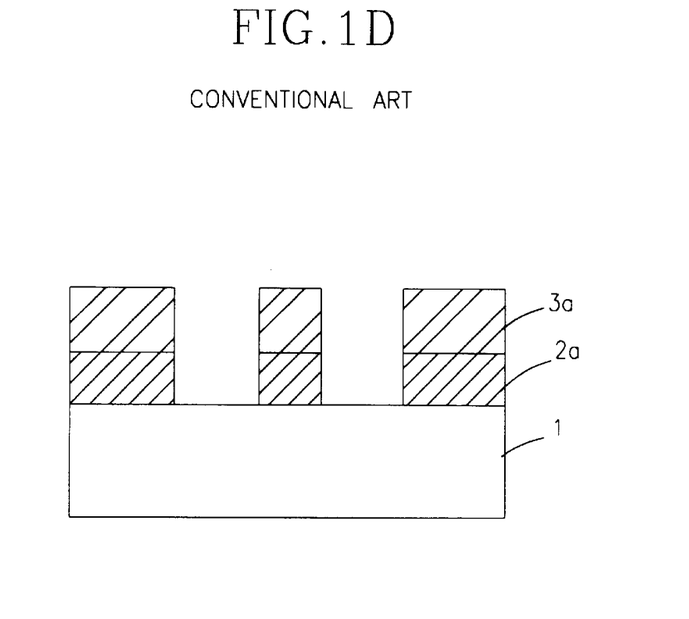

Next, in FIG. 1C, the photoresist film 3 is patterned by a photo-etching process, thus forming a photoresist pattern 3a. In FIG. 1D, the absorbent film 2 is etched using the photoresist pattern 3a as a mask, thus forming an absorbent film pattern 2a on the wafer 1.

Figure 1E:
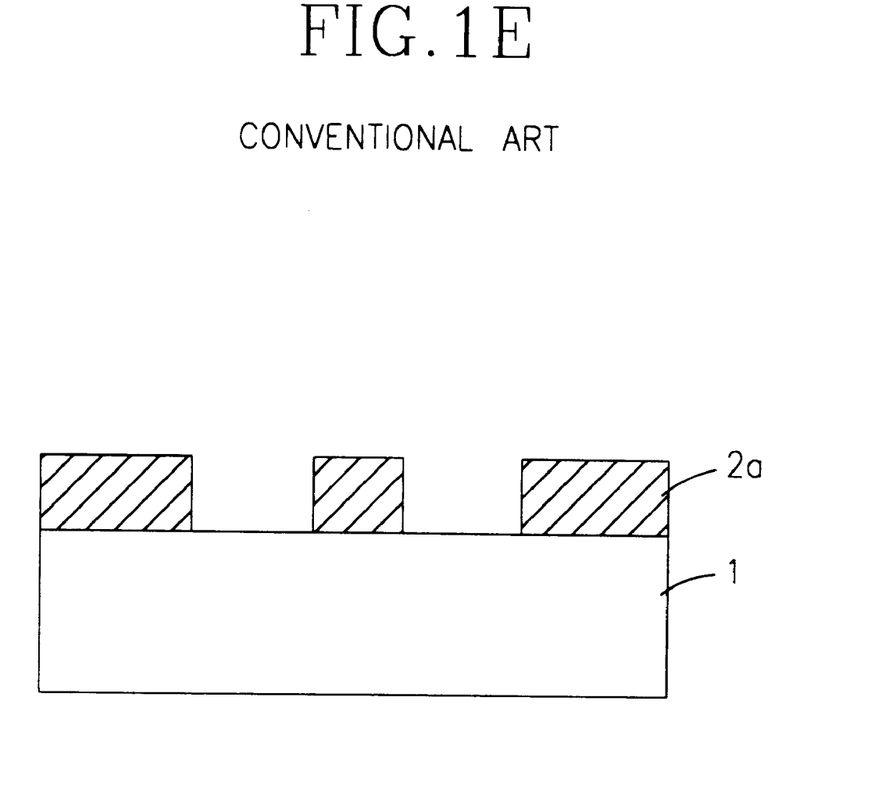

In FIG. 1E, the photoresist pattern 3a is removed, whereby the conventional mask for the semiconductor device is achieved. Next, a back side Si etch is performed, thus obtaining the conventional X-ray mask for the semiconductor device.

FIGS. 2A–2D sequentially illustrate a fabrication method of a conventional E-beam/X-ray mask for a semiconductor device applying the lift-off method.

Figure 2A:
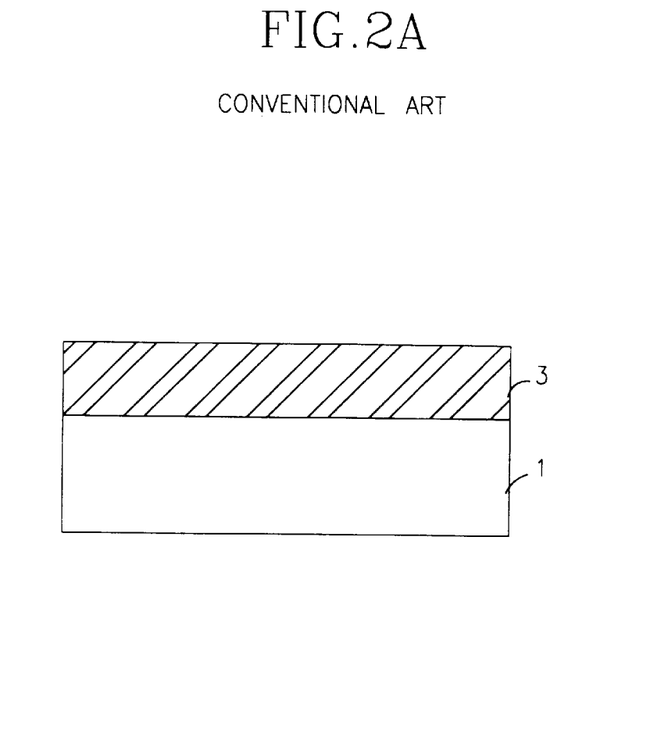
FIGS. 2A–2D sequentially illustrate a conventional fabrication method of an E-beam/X-ray mask for a semiconductor device applying a lift-off method.
Figure 2B:
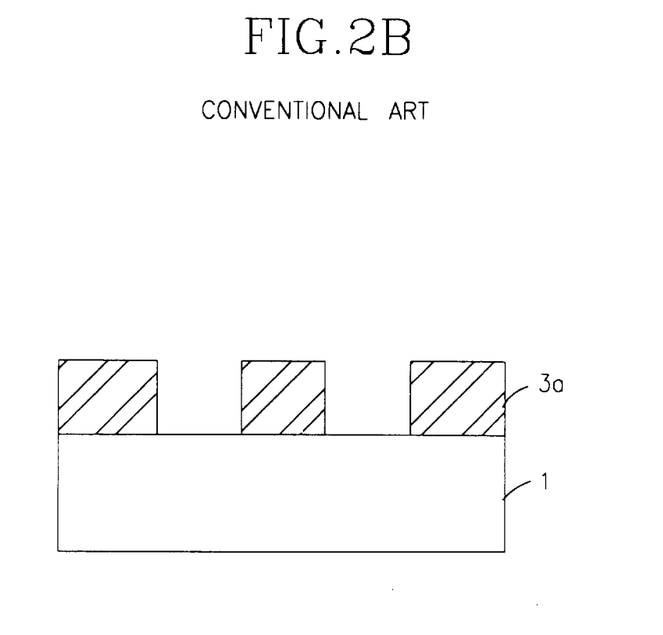

In FIGS. 2A and 2B, a photoresist film 3 is applied on a silicon wafer 1, and patterned by the photo-etching process, thus forming a photoresist pattern 3a.

Figure 2C:
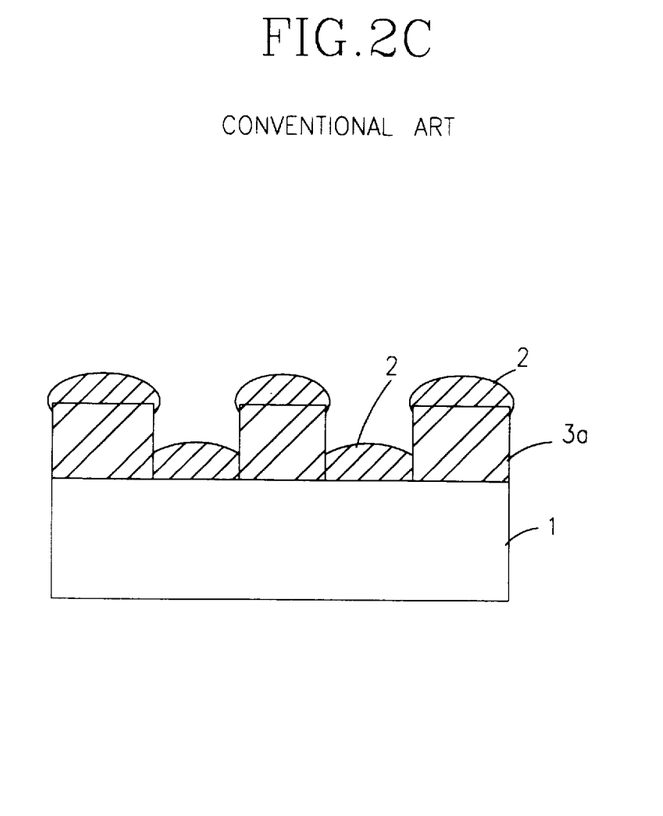

In FIG. 2C, a metal 2 is formed on the silicon wafer 1 and the photoresist pattern 3a. The metal 2 is physically deposited thereon by one of sputtering, evaporation, or ion clustering.

Figure 2D:
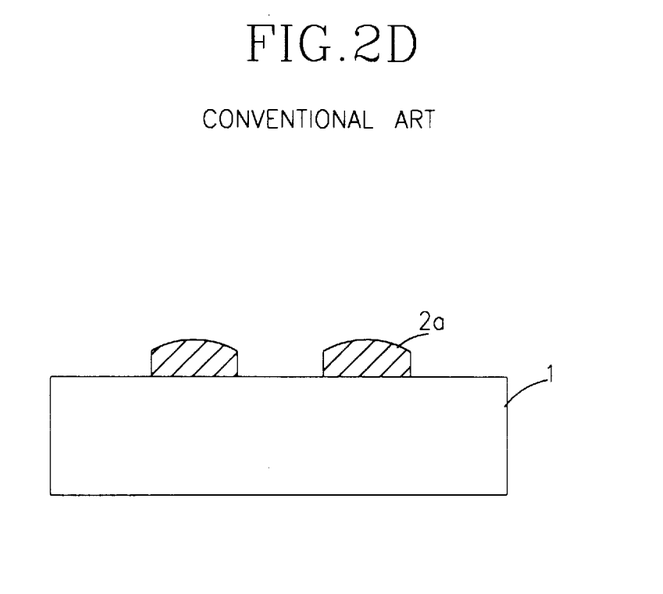

Next, as shown in FIG. 2D, a photoresist etching solution is used to remove the photoresist pattern 3a and a part of the metal 2 which is formed thereon. The part of the metal 2 which is formed on the silicon wafer 1 therefore remains, thus obtaining the conventional E-beam/X-ray mask for the semiconductor device using the lift-off method.

When manufacturing the conventional X-ray mask for the semiconductor device, a metal etching process is required for forming a metal pattern on a silicon wafer. When a thick metal layer is formed, it is difficult to etch the metal layer, and, particularly, it is hard to carry out an anisotropic etching process when forming a metal pattern, such as platinum, which seems to have difficulty in a dry-etching process. Also, according to the fabrication method of the conventional mask for a semiconductor device by the lift-off method, when step coverage is uniform so that a metal layer is formed on a sidewall of a photoresist pattern, it is hard to remove the metal layer formed on an upper surface of the photoresist pattern.

SUMMARY OF THE INVENTION

Accordingly, the present invention is directed to a fabrication method of a mask for a semiconductor device that obviates problems due to at least the above-mentioned limitations and disadvantages of the related art.

An object of the present invention is to provide a fabrication method of a mask for a semiconductor device which does not require a metal etching process when forming a metal pattern on a silicon wafer.

Another object of the present invention is to provide a fabrication method of a mask for a semiconductor device, wherein a sidewall of a photoresist film has a predetermined part on which a metal is not formed when depositing the metal, and therefore the metal layer is separately formed on an upper surface of the photoresist film and on a wafer. Thus, the method of the present invention is capable of removing the metal layer formed on the upper surface of the photoresist film by a lift-off method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabrication method of a mask for a semiconductor device includes the steps of: applying a first photoresist film on a silicon wafer; sequentially forming first and second insulation films, and a second photoresist film on the first photoresist film; patterning the second photoresist film by an etching process; etching and patterning the first and second insulation films by using the patterned second photoresist film as a mask; etching and patterning the first photoresist film by using the patterned second photoresist film, and first and second insulation films as a mask; removing the second photoresist film; etching a predetermined portion of the first insulation film; depositing a metal on the wafer including the first photoresist film, the first insulation film having the predetermined etched portion, and the second insulation film; and removing the first photoresist film, and the first and second insulation films from the wafer.

It is to be understood that both the foregoing general description and the following detailed description are exemplary and explanatory, and that they are intended to provide and further explain the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

FIGS. 3A–3G sequentially illustrate a fabrication method of an E-beam/X-ray mask for a semiconductor device applying a lift-off method according to the present invention.

Figure 3A:
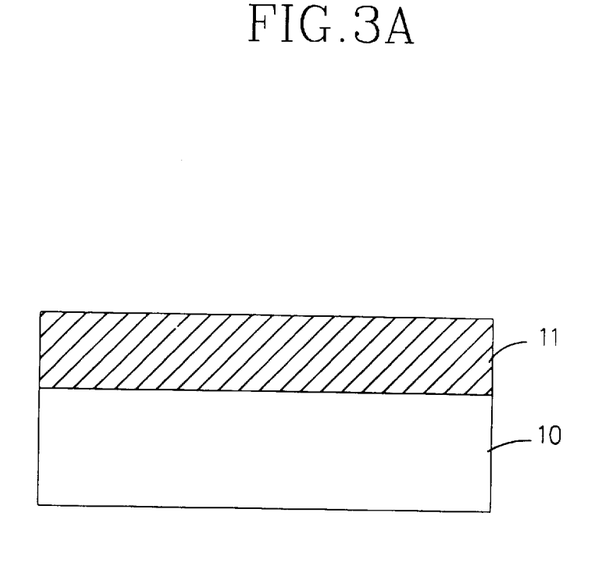
FIGS. 3A–3G sequentially illustrate a fabrication method of an E-beam/X-ray mask for a semiconductor device applying a lift-off method according to the present invention.

In FIG. 3A, a photoresist film is applied on a silicon wafer 10, thus forming a first photoresist film 11 on the silicon wafer 10. A silicon nitride film may be substituted for the first photoresist film 11.

Figure 3B:
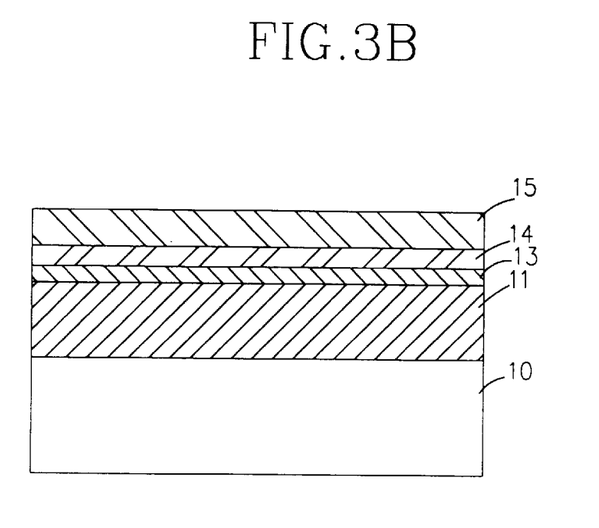

In FIG. 3B, a first insulation film 13, a second insulation film 14, and a second photoresist film 15 are sequentially stacked on the first photoresist film 11. The first insulation film 13 is formed of silicon oxide $SiO_2$ or SOG (spin-on-glass), and the second insulation film 14 is formed of silicon nitride $Si_3N_4$. A third photoresist film (not shown) is then applied to the second photoresist film 15.

Figure 3C:
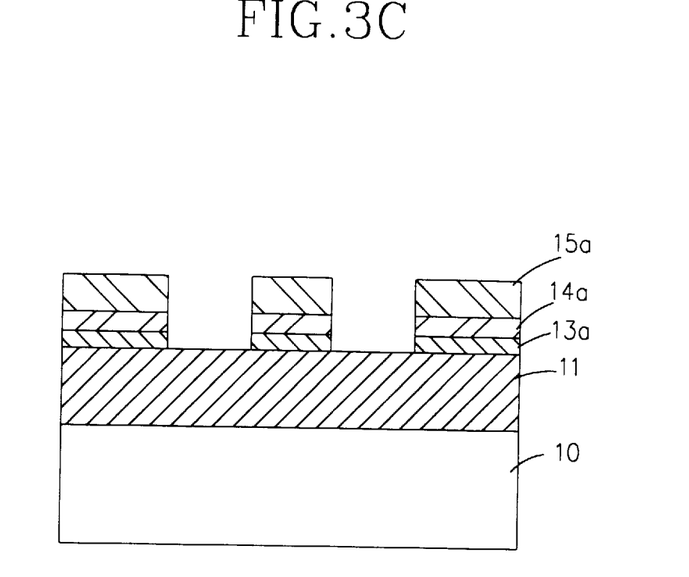

In FIG. 3C, a second photoresist pattern 15a is formed by patterning the second photoresist film 15 using a photo-etching process. By using the second photoresist pattern 15a as a mask, the first and second insulation films 13, 14 are etched by an anisotropic etching process, thus forming first and second insulation film patterns 13a, 14a. When a buffer oxide etch (BOE) solution etches the first and second insulation films 13, 14, the two insulation films have different etching rates with respect to the BOE solution.

Figure 3D:
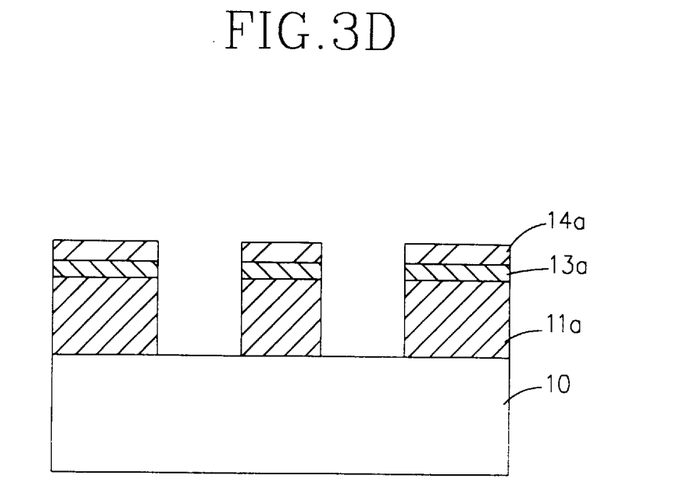

In FIG. 3D, a first photoresist pattern 11a is formed by applying a dry-etching process to the first photoresist film 11, using the first and second insulation film patterns 13a, 14a, and the second photoresist film pattern 15a as a mask. A predetermined portion of an upper surface of the silicon wafer 10 is therefore exposed, and the second photoresist pattern 15a is removed. The second photoresist pattern 15a may be used as a mask for patterning the first photoresist film 11 as mentioned above, and may be removed simultaneously with a predetermined portion of the first photoresist film 11 to be etched. If the latter, the second insulation pattern 14a is used as a mask for patterning the first photoresist film 13.

Also, if the second photoresist pattern 15a is not removed before a metal 16 is deposited, the metal 16 may be deposited using the surface of the second photoresist pattern 15a to shield the exposed surface portion of the first photoresist pattern 11a.

Figure 3E:
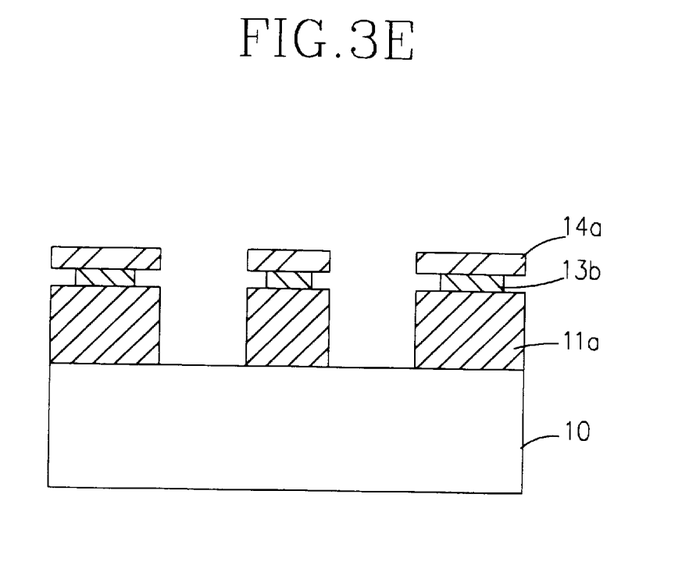

Next, in FIG. 3E, a portion (e.g., a half portion) of the first insulation pattern 13a is etched by an isotropic wet-etching process. Therefore, a predetermined portion of a lower surface of the second insulation film 14a and an upper surface of the first photoresist film pattern 11a is exposed. The resultant etched first insulation film pattern 13a after the isotropic wet-etching process is identified as a first insulation film pattern 13b.

Figure 3F:
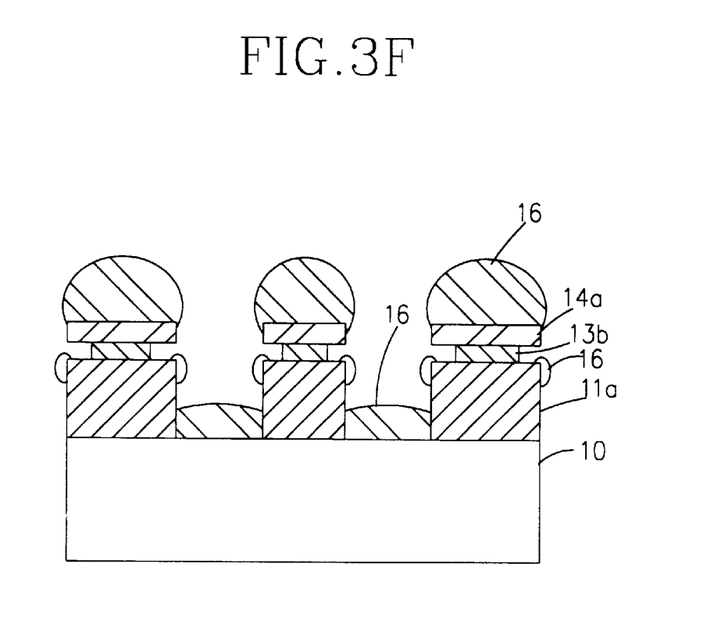

In FIG. 3F, a metal 16 is deposited on the exposed portions of the wafer 10, and one or more of the exposed portions of the first photoresist pattern 11a, the first insulation pattern 13b, and the second insulation film 14a. As shown in FIG. 3F, the space formed by isotropically etching the first insulation film pattern is not completely filled or isolated by the metal 16. The metal 16 is deposited by sputtering, evaporation, or ion-clustering. Examples of materials that could be used for metal 16 include tungsten (W), gold (Au), or platinum (Pt).

Figure 3G:
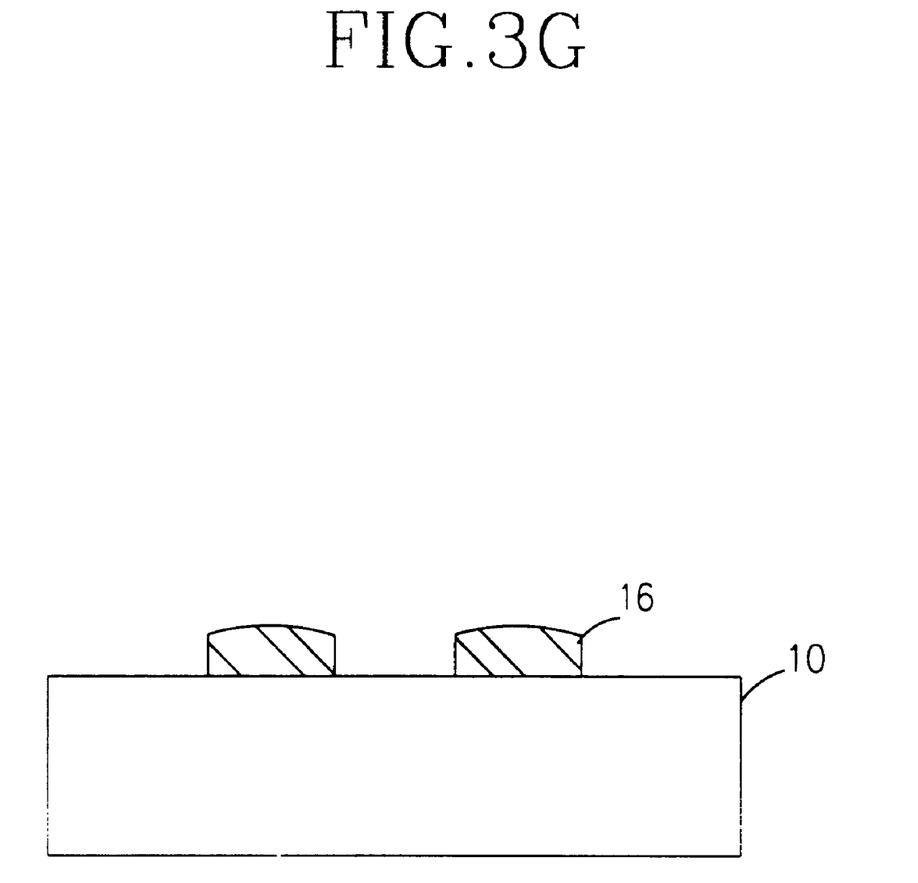

Lastly, in FIG. 3G, the lift-off method is applied to remove portions of the metal 16 other than a part thereof formed directly on the wafer 10, by using a photoresist etch solution, thus obtaining the E-beam/X-ray mask for the semiconductor device according to the present invention.

Some, but not all, of the advantages achieved by the fabrication method of the mask for the semiconductor device according to the present invention include those discussed hereinafter.

Since the sidewall of the first photoresist pattern has a predetermined portion on which the metal is not deposited, the metal is separately formed on the upper surface of the second photoresist pattern and on the wafer. Thus, after depositing the metal, the present invention is capable of removing the metal formed on the upper surface of the second photoresist pattern which is separated from the metal formed on the wafer. In addition, the method according to the present invention sequentially removes the first insulation film, metal, second insulation film, and first photoresist film in a chemical method, thus obtaining a smooth sidewall of the resultant metal pattern. Also, when step coverage is uniform in case of metal deposition, the sidewall of the resultant metal pattern can be vertically maintained.

It will be apparent to those skilled in the art that various modifications and variations can be made in the data output buffer for memory device of the present invention without departing from the spirit or scope of the invention. Thus, it is intended that the present invention cover the modifications and variations of this invention provided they come within the scope of the appended claims and their equivalents.

What is claimed is:

1. A method of fabricating a mask for a semiconductor device, comprising:

applying a first photoresist film on a silicon wafer;

sequentially forming a first insulation film, a second insulation film, and a second photoresist film on the first photoresist film;

patterning the second photoresist film by an etching process;

patterning the first and second insulation films by etching using the patterned second photoresist film as a mask;

patterning the first photoresist film by etching using the patterned first and second insulation films, and the patterned second photoresist film as a mask;

removing the second photoresist film;

etching a predetermined portion of the first insulation film;

depositing a metal on the silicon wafer and on at least one of the first photoresist film, the first insulation film having the predetermined etched portion, and the second insulation film; and removing the first photoresist film, and the first and second insulation films from the silicon wafer.

2. The method of claim 1, wherein a third insulation film substitutes for the first photoresist film.

3. The method of claim 2, wherein the third insulation film is a silicon nitride film.

4. The method of claim 1, wherein the first insulation film is formed of silicon oxide ($SiO_2$) or spin-on-glass (SOG) when the first insulation film is etched using a buffer oxide etch (BOE) solution.

5. The method of claim 1, wherein the second insulation film is formed of silicon nitride ($Si_3N_4$) when the second insulation film is etched using a buffer oxide etch (BOE) solution.

6. The method of claim 1, wherein the first and second insulation films respectively have different etching rates when being etched by a buffer oxide etch (BOE) solution.

7. The method of claim 1, wherein a portion of the patterned first insulation film is etched by an isotropic wet-etching process.

8. The method of claim 1, wherein etching the predetermined portion of the first insulation film exposes a surface portion of the patterned first photoresist film.

9. A method for fabricating a mask for a semiconductor device, comprising:

providing a first photoresist pattern on a wafer, an insulating pattern on the first photoresist pattern, and a second photoresist pattern on the insulating pattern;

etching the insulating pattern to expose a surface portion of the first photoresist pattern;

depositing metal on exposed portions of the wafer and above the insulating pattern, the surface portion of the first photoresist pattern remaining exposed after the metal is deposited; and removing the first photoresist pattern, the insulating pattern, the second photoresist pattern and the metal deposited above the insulating pattern.

10. The method recited by claim 9, wherein providing the first photoresist pattern, the insulating pattern and the second photoresist pattern comprises:

depositing a first photoresist film on the wafer;

depositing an insulating film on the first photoresist film;

depositing a second photoresist film on the insulating film;

forming the second photoresist pattern by etching the second photoresist film;

forming the first insulating pattern by etching the first insulating film using the second photoresist pattern as a mask; and forming the first photoresist pattern by etching the first photoresist film using the second photoresist pattern and first insulating pattern as masks.

11. The method recited by claim 10, further comprising:

depositing a second insulating film on the insulating layer, before the second photoresist film is deposited;

forming a second insulating pattern by etching the second insulating film using the second photoresist pattern as a mask; and removing the second photoresist pattern, wherein the second insulating pattern is used as a mask for forming the insulating pattern and the first photoresist pattern.

12. The method recited by claim 11, wherein etching the first insulating pattern to expose a portion of the first photoresist pattern is performed after the second insulating pattern is formed.

13. A method of fabricating a mask for a semiconductor device comprising:

applying a first photoresist film on a silicon wafer;

sequentially forming a first insulation film, a second insulation film, and a second photoresist film;

exposing a portion of an upper surface of the second insulation film by patterning the second photoresist film;

patterning the first and second insulation films by etching using the patterned second photoresist film as a mask;

patterning the first photoresist film by etching using the patterned first and second insulation films as mask, the second photoresist pattern being removed simultaneously with a portion of the first photoresist film to be etched;

etching a predetermined portion of the first insulation film;

depositing a metal on the silicon wafer and on at lest one of the first photoresist film, the first insulation film having the predetermined etched portion, and the second insulation film; and removing the first photoresist film, and the first and second insulation films from the silicon wafer.

14. A method of fabricating a mask for a semiconductor device, comprising:

applying a first photoresist film on a silicon wafer;

sequentially forming a first insulation film, a second insulation film, and a second photoresist film on the first photoresist film;

forming a second photoresist pattern by an etching process;

patterning the first and second insulation films by etching using the second photoresist pattern as a mask;

patterning the first photoresist film by an etching process;

etching a predetermined portion of the first insulation film;

depositing a metal on the silicon wafer and on at least one of the fist photoresist film, the first insulation film having the predetermined etched portion, and the second insulation film; and removing the first photoresist film and the first and second insulation films from the silicon wafer, wherein the second photoresist pattern is used as a mask for patterning the first photoresist film and is removed before metal is deposited.

15. A method of fabricating a mask for a semiconductor device, comprising:

applying a first photoresist layer on a silicon wafer;

sequentially forming a first insulating layer and a second photoresist layer on the first photoresist layer;

patterning the second photoresist layer to form a second photoresist pattern;

patterning the first insulating layer using the second photoresist pattern as mask;

etching and patterning the first photoresist layer using the patterned first insulating layer and the second photoresist pattern as a mask;

further etching the patterned first insulating layer to expose a surface portion of the patterned first photoresist layer;

depositing metal using a surface of the second photoresist pattern to shield the exposed surface portion of the patterned first photoresist layer; and removing the patterned first photoresist layer, the patterned first insulating layer and the second photoresist pattern.

16. The method as recited by claim 15, further comprising:

depositing a second insulating layer on the first insulating layer, before the second photoresist layer is deposited;

forming a second insulating pattern by etching the second insulating film using the second photoresist pattern as a mask; and removing the second photoresist pattern, wherein the second insulating pattern is used as a mask for forming the patterned first insulating layer and the patterned first photoresist layer.

* * * * *